United States Patent
Guedj et al.

(10) Patent No.: US 7,355,227 B2
(45) Date of Patent: Apr. 8, 2008

(54) DETECTING PIXEL MATRIX INTEGRATED INTO A CHARGE READER CIRCUIT

(75) Inventors: Cyril Guedj, Varces Allieres et Risset (FR); Norbert Moussy, Sainte Agnes (FR)

(73) Assignee: Commissariat a l'Energie Atomique, Paris (FR)

( * ) Notice: Subject to any disclaimer, the term of this patent is extended or adjusted under 35 U.S.C. 154(b) by 21 days.

(21) Appl. No.: 10/548,070

(22) PCT Filed: Mar. 3, 2004

(86) PCT No.: PCT/FR2004/050091

§ 371 (c)(1),
(2), (4) Date: Sep. 6, 2005

(87) PCT Pub. No.: WO2004/081517

PCT Pub. Date: Sep. 23, 2004

(65) Prior Publication Data

US 2006/0180889 A1   Aug. 17, 2006

(30) Foreign Application Priority Data

Mar. 6, 2003   (FR) .................................. 03 02782

(51) Int. Cl.
*H01L 31/113*   (2006.01)
(52) U.S. Cl. ............... 257/292; 257/233; 257/E27.133; 257/E27.149; 257/E27.241; 257/E33.077
(58) Field of Classification Search ............ 257/8, 257/84, 113, 443, 448, 292, E27.149, E33.077, 257/233, E27.133, E27.241; 250/370.09, 250/370.11
See application file for complete search history.

(56) References Cited

U.S. PATENT DOCUMENTS

| 4,651,180 | A | 3/1987 | Nishizawa et al. |
| 5,236,871 | A | 8/1993 | Fossum et al. |
| 5,602,392 | A | 2/1997 | Owen et al. |
| 6,215,164 | B1 | 4/2001 | Cao et al. |
| 2003/0111610 | A1* | 6/2003 | Wagenaar et al. ..... 250/363.04 |
| 2004/0200972 | A1* | 10/2004 | Nam et al. .............. 250/370.11 |

FOREIGN PATENT DOCUMENTS

| EP | 0 555 907 | 8/1993 |
| EP | 1 122 790 | 8/2001 |

* cited by examiner

*Primary Examiner*—Long K. Tran
(74) *Attorney, Agent, or Firm*—Oblon, Spivak, McClelland, Maier & Neustadt, P.C.

(57) ABSTRACT

A matrix of detection pixels and a photoelectric detector that includes a matrix of detection pixels and a reading circuit of loads detected by the detection pixels of the matrix. A detection pixel includes a photosensitive semi-conductor area with a first face covered with a first electrode and a second face located opposite the first face and covered with a second electrode. The first electrode includes a metal pattern that can collect the electrical loads generated by the detection pixel. The matrix can be applied, for example, to the creation of sensors used in scanners and photographic apparatuses or digital cameras or biosensors.

21 Claims, 6 Drawing Sheets

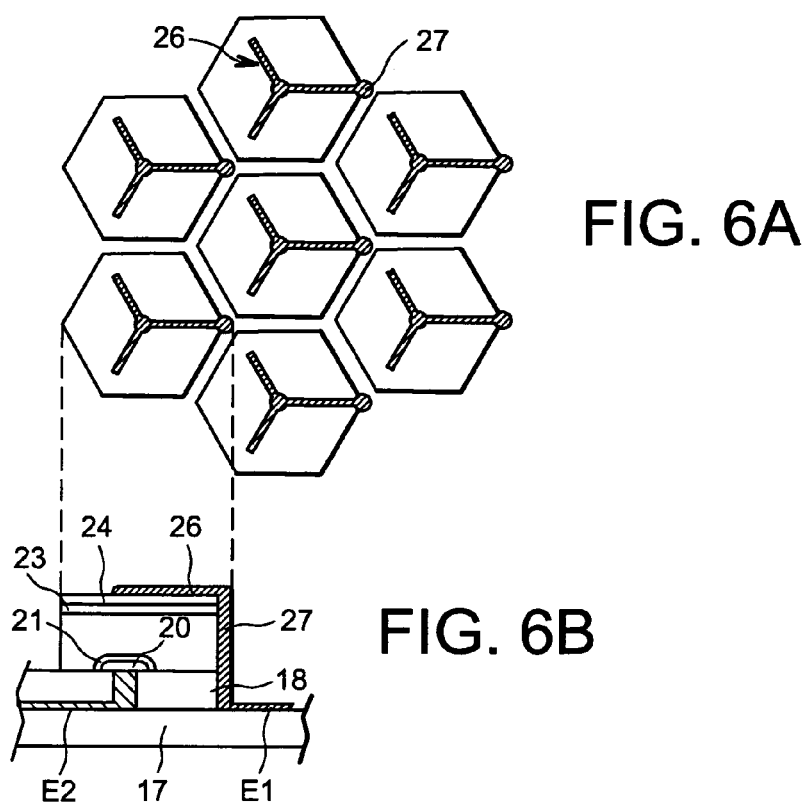
FIG. 6A
FIG. 6B
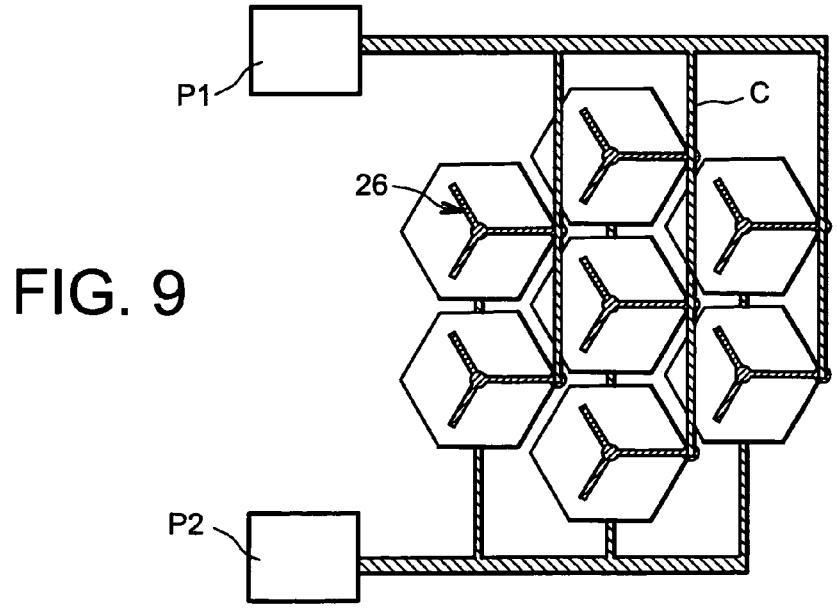
FIG. 9

DETECTING PIXEL MATRIX INTEGRATED INTO A CHARGE READER CIRCUIT

DOMAIN OF THE TECHNIQUE AND PRIOR ART

This invention relates to a matrix of detection pixels as well as a photoelectric detector that includes a matrix of detection pixels and a reading circuit of the loads generated by the detection pixels of the matrix.

This invention also relates to a procedure for manufacturing a matrix of detection pixels as well as a procedure for manufacturing a photoelectric detector that includes a matrix of detection pixels and a reading circuit of the loads generated by the detection pixels of the matrix.

The invention is applicable to, for example, the creation of sensors used in scanners, photographic apparatuses, and digital cameras, as well as micro-chips, in particular, for DNA sequencing.

A photoelectric detector according to the invention allows creating, for example, an anti-glare imager that is monolithically integrated into the surface of a CMOS (Complementary Metal-Oxide Semi-Conductor) technology reading circuit.

Current technologies in the manufacture of imagers monolithically placed on a CMOS reading circuit consist in placing successive NIP, IP, PIN, or IN type layers on the reading circuit contact studs. A conductor transparent oxide layer attached to all the pixels is then placed to form a top electrode that descends sideways along the periphery of the photodiode matrix.

This technique allows creating imagers in a collective and monolithic manner, without having to perform additional welding to attach the top contact to the CMOS reading circuit. This saves time, lowers costs, and increases the reliability of the components.

Nevertheless, a disadvantage resides in the presence of side leaks of the loads or photons between pixels. This phenomenon of side leaks of loads or photons between pixels is known as intermodulation. Several techniques are known for reducing intermodulation.

A first technique consists in separating the pixels from each other using insulating areas, as described in patent U.S. Pat. No. 6,215,164. This technique is represented in FIG. 1. A substrate is covered with an interconnection structure 2 in which the conductive connections 3a, 3b, 3c, 3d are formed. A plurality of detection pixels are formed on the surface of the interconnection structure 2. Each detection pixel includes an intrinsic semi-conductor area 6 surrounded by two electrodes. A fist electrode 5 is connected using a metal contact stud 4 to a conductor connection formed in the structure 2. Insulating dielectric regions 7 separate the intrinsic semi-conductor areas 6 from each other. A doped P layer 8 covers all the semi-conductor areas 6 and the insulating dielectric regions 7. A transparent conductor layer 9 covers the layer 8 and constitutes the second electrode for all the detection pixels. The conductor layer 9 is electrically connected to the substrate using one of the conductor connections formed in the interconnection structure 2.

The dielectric regions 7 advantageously allow insulating the detection pixels from each other. The presence of dielectric regions 7 is nevertheless a source of disadvantages. Indeed, there are significant risks of leaks in the interface between the semi-conductor areas 6 and the insulating dielectric regions 7. Indeed, in the volume of an insulating dielectric medium, the atoms are attached to their neighbours in a homogeneous manner, in contrast with what occurs on the surface, where certain atoms have deformed atomic links. A deformation of certain atomic links is therefore present on the interface of the insulating dielectric regions 7 and in the semi-conductor areas 6. This creates defective centres that may become conductive.

Furthermore, the transparent conductor layer 9 that completely covers the photosensitive layer partially absorbs the light received, thus reducing the number of detected photons. Additionally, the transparent conductor layer 9 is also an oxide layer. Therefore, the properties of the conductor transparent oxides develop over time and their manufacture is not always simple and able to be reproduced. This represents another disadvantage.

A second technique consists in creating optical layers to prevent the light from hitting the areas located between electrodes. This technique, described in patent EP 1 122 790, is represented in FIG. 2. A substrate 10 is covered with an interconnection structure 11 in which the conductive connections 12a, 12b, 12c, 12d are formed. A plurality of detection pixels are formed on the surface of the interconnection structure 11. Each detection pixel includes an intrinsic semi-conductor area surrounded by two electrodes. A first electrode 13 is attached to a metal connection formed in the substrate 11. An intrinsic semi-conductor layer 14 covers the substrate 11 and the metal contact studs 13 so that the layer fractions 14 that cover the electrodes 13 constitute the semi-conductor areas of the detection pixels. A doped P semi-conductor layer 15 covers the layer 14 and constitutes the second electrode for all the detection pixels.

A non transparent conductor layer 16 covers layer 15. The non transparent conductor layer 16 includes openings 17 positioned along the vertical of the detection pixels in order to let the photons pass. Non transparent areas 18 separate the openings 17 and constitute optical masks that mask the photosensitive areas located between neighbouring pixels. The presence of optical masks leads to a significant reduction of the number of detected photons. The filling factor of the imager is significantly decreased. Furthermore, the optical masks nonetheless do not prevent electrical loads from circulating between neighbouring pixels through the intrinsic semi-conductor layer 14. This technique therefore decreases optical intermodulation but not electrical intermodulation.

In a general manner, intermodulation is currently an increasing critical issue in reducing the size of pixels. Indeed, the distance between pixels is currently becoming comparable to the free average path of electrons in photosensitive areas (normally in the range of a micrometer.) To overcome the problems that arise from such proximity, it is often necessary to design specially adapted reading circuits. This represents another disadvantage.

The invention does not present any of the disadvantages mentioned above.

PRESENTATION OF THE INVENTION

Indeed, the invention relates to a matrix of detections pixels; a detection pixel includes a photosensitive semiconductor area with a first face covered by a first electrode and a second face located at the opposite end of the first face and covered by a second electrode; the photosensitive semiconductor area allows converting the photons acting on the first face into charge carriers; the first electrode includes a metal pattern that can collect the charge carriers generated in the photosensitive semi-conductor area. The shape of the metal pattern is adapted so that the photosensitive semiconductor area notably constitutes, in its entirety, a collection area for all the charge carriers generated in the photosensitive semi-conductor area.

According to an additional characteristic of the invention, the shape of the metal pattern is such that all the points of the photosensitive semi-conductor area of the detection pixel are at a distance from the metal pattern that is four times less than the distribution length of the charge carriers in the material of the photosensitive semi-conductor area.

According to still another additional characteristic of the invention, the detection pixels are grouped into blocks; a block of detection pixels is a plurality of neighbouring detection pixels whose metal patters are electrically linked to each other.

According to still another additional characteristic of the invention, trenches separate at least one detection pixel from at least one neighbouring detection pixel.

According to still another additional characteristic of the invention, the first face of a detection pixel is in the shape of a hexagon.

According to still another additional characteristic of the invention, the shape of the metal patter is adapted to drain the charge carriers in a notably central area of the detection pixel.

According to still another additional characteristic of the invention, a metal pattern includes a set of tracks in the form of stars with several branches; the centre of the star is notably placed at the centre of the first face.

According to still another additional characteristic of the invention, a metal pattern includes at least one circular track and at least one straight-line track that cuts the circular track at a right angle; the centre of the circular track is notably positioned at the centre of the first face.

According to still another additional characteristic of the invention, a metal pattern includes at least one track in the form of a hexagon that is notably centred on the first face and at least one straight-line track that passes through the centre of the hexagon and through two peaks that are symmetrical with respect to the centre.

According to still another additional characteristic of the invention, the tracks have a width that is notably less than 03 micrometers.

According to still another additional characteristic of the invention, the metal pattern is in Al, Cu, Cr, Ni, W, Ti, TiW, Mo, In, Pt, Pd, Au, or TiN, or in a metal alloy chosen from the previously mentioned metals.

According to still another additional characteristic of the invention, the second electrode is composed of an electrical contact and a diffusion barrier layer.

According to still another additional characteristic of the invention, a detection pixel includes, between the first face of the photosensitive semi-conductor area and the metal pattern of the first electrode, a diffusion barrier layer that is in contact with the first layer and a doped P semi-conductor layer that covers the diffusion barrier layer.

According to still another additional characteristic of the invention, la photosensitive semi-conductor area is in amorphous silicon or in polymorphous silicon.

The invention also relates to a photoelectric detector that includes a matrix of detection pixels and a reading circuit of the charge carriers detected by the detection pixels. The matrix of detection pixels is a matrix according to the invention formed on a dielectric layer in which electrical connections are inserted; at least one detection pixel has the metal patter of the first electrode attached, using a metal link, to a first electrical connection and the second electrode is electrically attached to a second electrical connection.

According to an additional characteristic of the invention, the dielectric layer is directly formed on the reading circuit.

According to still another additional characteristic of the invention, the reading circuit is a CMOS circuit.

The invention also relates to a procedure for manufacturing the matrix of detection pixels according to the invention. The procedure includes, for a detection pixel, the creation of a first electrode on a first face of the photosensitive semi-conductor area; the second electrode include the formation of a metal pattern designed to collect the charge carriers generated in the photosensitive semi-conductor area. The formation of the metal pattern is adapted so that the photosensitive semi-conductor area notably constitutes, in its entirety, a collection area for all the charge carriers generated in the photosensitive semi-conductor area.

The invention also relates to procedure for manufacturing a photoelectric detector that includes a matrix of detection pixels and a reading circuit of the charge carriers detected by the detection pixels. The photoelectric detection manufacturing procedure includes:

the formation, on the reading circuit, of a dielectric layer in which electrical connections are inserted; an electrical connection includes a first end that opens on the first face of the dielectric layer and a second end that opens on a second face of the dielectric layer that is opposite the first face; the first ends of the electrical connections are electrically connected using the conductor contact studs of the reading circuit.

the formation of electrical contacts on the second ends of the electrical connections.

the depositing of a photosensitive semi-conductor layer on the dielectric layer and on the electrical contacts.

the depositing of all the metal patterns in such a way so as to form the detection pixels of the matrix; a detection pixel includes a photosensitive semi-conductor area with a first face covered with a first electrode that includes a metal pattern and a second face covered with a second electrode composed of an electrical contact; the shape of the metal pattern is adapted so that a photosensitive semi-conductor area of the detection pixel notably constitutes, in its entirety, a collection area for all the charge carriers generated in the photosensitive semi-conductor area of the detection pixel.

the formation of a set of conductor links; a conductor link connects a metal pattern to an electrical contact.

According to an additional characteristic of the invention, the procedure for manufacturing the photoelectric detector includes, in a successive manner, the depositing of a diffusion barrier layer and the depositing of a doped P semi-conductor layer on the photosensitive semi-conductor layer before the depositing of all the metal patterns.

According to still another additional characteristic of the invention, the depositing of all the metal patterns is preceded by the formation of sections in the photosensitive semi-conductor layer; the sections allow separating at least one detection pixel from at least one neighbouring detection pixel.

According to still another additional characteristic of the invention, the conductor links are formed in the sections.

A photoelectric device according to the invention is an anti-glare structure with very low intermodulation that allows individually addressing each pixel or block of pixels. Furthermore, the material chosen according to the preferred embodiment of the invention allows significantly decreasing aging and increasing dynamic performance. The diodes obtained are quicker, much more stable over time, and resistant to significant local glares. This results in a clear improvement in performance. Additionally, the manufacturing procedure of the structure is simple and robust.

The metal pattern formed at the surface of a detection pixel is designed to notably collect all the charge carriers created in the pixel volume. Advantageously, the entire photosensitive semi-conductor area of a detection pixel therefore notably constitutes a collection area for all the charge carriers generated in the photosensitive semi-conductor area. A charge carrier collection area is the area in which any charge carrier generated is almost sure to be collected by the electrode; the probability of the collector of charge carriers generated beyond this area is virtually null.

According to a specific embodiment of the invention, the electric field lines are concentrated at the centre of the pixel, thus allowing drainage of the charge carriers detected at the centre of the pixel. It is therefore possible to avoid any side dispersion of the detected charge carriers.

This invention allows cross-linking each detection pixel. Cross-linking thus prevents, for example, excess loads from reaching neighbouring pixels. This results in an improved image definition. The top electrode metal patter constitutes an equipotential line that efficiently collects charge carriers. Furthermore, it is also possible to individually address each pixel, since the top electrode is not necessarily common. Three subnetworks of pixels for the colours Red, Green and Blue (respectively) can thus be composed. Additionally, the use of polymorphous silicon for composing the photosensitive material allows significantly increasing stability over time, speed, and efficiency of the photoelectric conversion. This material is particularly resistant to strong light intensities and has a status density that is so low that the impulsive load dynamic is significantly improved. The remanence obtained with such material is lower than that obtained with standard material, which allows operation at very high frequencies. The technology implemented according to the preferred embodiment of the invention is therefore compatible with a wide range of existing CMOS reading circuits, both analogue and digital circuits.

Advantageously, the invention allows avoiding the glare of pixels and obtain quick and very stable images in time, which are resistant to intense lights (explosions, significant magnifications, significant focusing, etc.) Because each pixel can be individualised, corrections can be made to defective pixels in order to homogenise the image with little lighting. It is also possible to perform image processes integrated within the imager (intelligent retinas) and/or any operation that requires individually accessing the two electrodes of each photodiode.

The invention considers an application particularly advantageous for creating pixels with a diameter of approximately a few microns, because the diffusion length of the charge carriers that are photogenerated in a pixel is such that they easily achieve the metal pattern of the top electrode. This is one of the most original aspects of the invention.

Another advantage of the invention in comparison to prior technologies is greater realisation simplicity. Indeed, according to the invention, it is possible to be clear of the use of conductor transparent oxide and the top electrode can advantageously be exclusively composed of metal that is traditionally used in CMOS technology.

BRIEF DESCRIPTION OF FIGURES

Other characteristics and advantages of the invention will become evident upon reading a preferred embodiment of the invention, among which:

FIGS. 6A and 6B represent, respectively, a top view and partial cut view of a group of pixels of the imager grouped according to the example in FIG. 5.

FIG. 9 represents a specific embodiment of the invention.

On all the Figures, the same indications describe the same elements.

DETAILED DESCRIPTION OF EMBODIMENTS OF THE INVENTION

Figure 1:
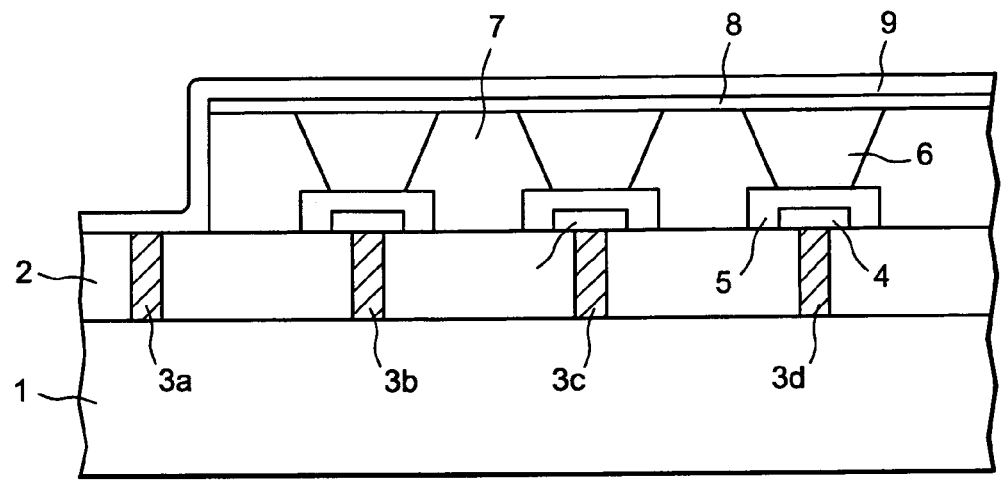
FIG. 1 represents a first example of the imager according to the prior art.
Figure 2:
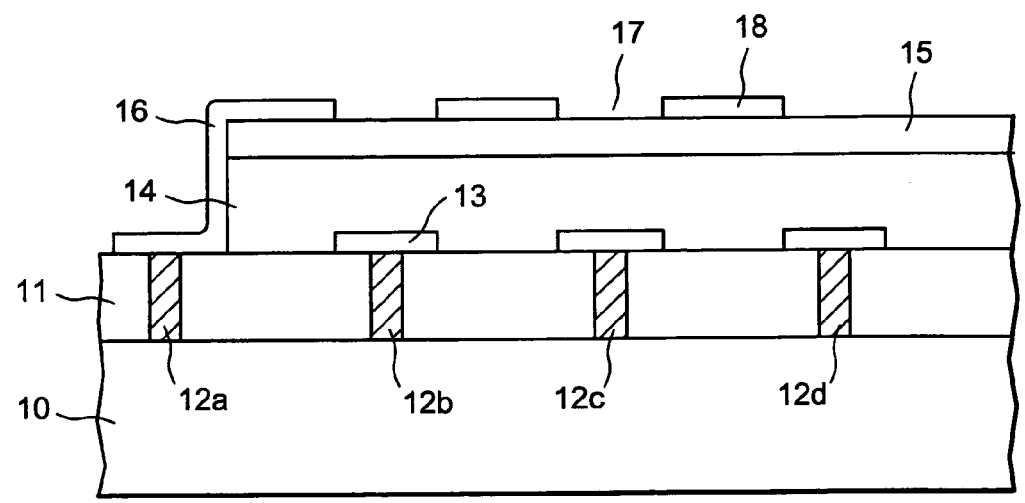
FIG. 2 represents a second example of the imager according to the prior art.
Figure 3:
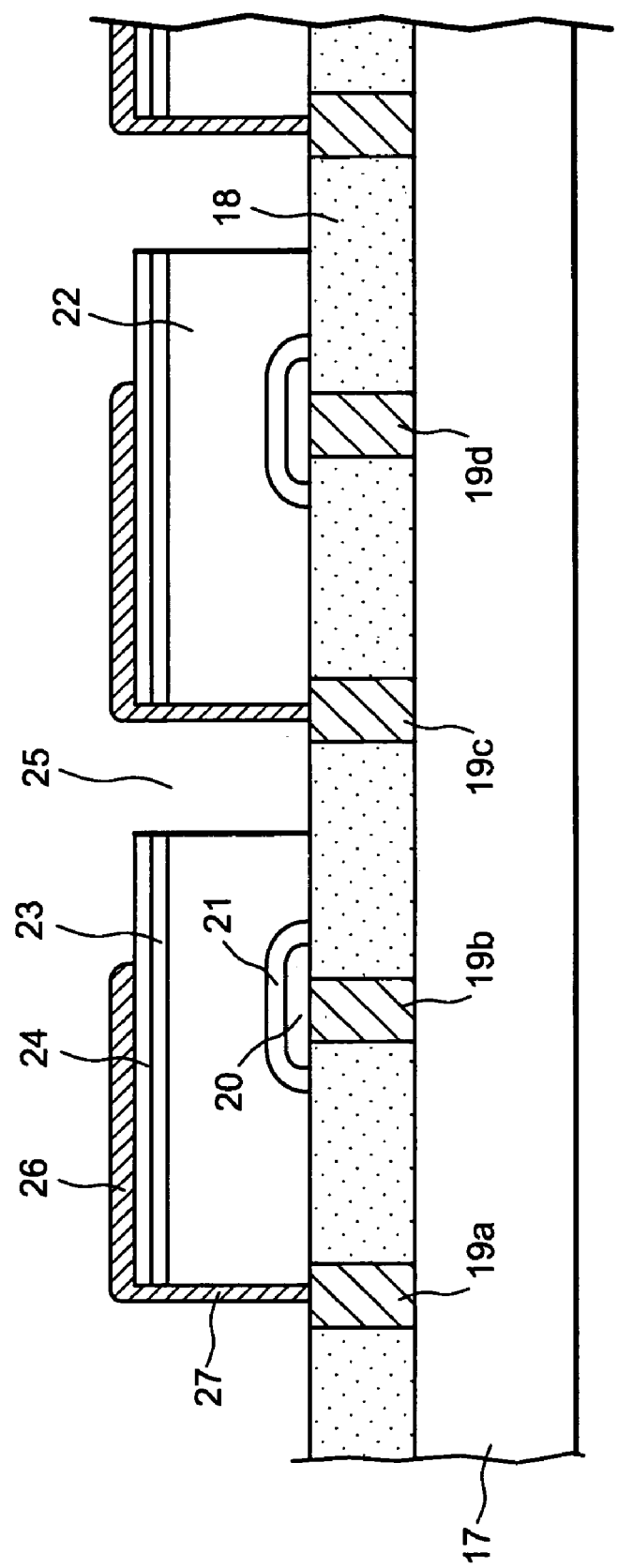
FIG. 3 represents the cross-section view of the imager according to the invention.

FIG. 3 represents the cross-section view of the imager according to the invention.

On a substrate 17, which may be, for example, a CMOS type reading circuit, a dielectric layer 18 may be placed and in which electrical connections 19a, 19b, 19c, 19d can be formed. The electrical connections 19a, 19b, 19c, 19d are attached to the contact studs of the reading circuit (no represented in FIG. 3.) A plurality of detection pixels are formed on the surface of the dielectric layer 18. Each detection pixel includes photosensitive semi-conductor area 22 surrounded by two electrodes. An electronically conductive diffusion barrier region 20 (for example, a TiN layer) and a conductor contact 21 (for example, a doped n semi-conductor layer) constitutes a first electrode created upon contact with an electrical connection (19b, 19d) inserted in the dielectric layer. The semi-conductor area 22 is a photosensitive region made of, for example, non doped amorphous silicon or non doped polymorphous silicon. Preferably, but not mandatorily, the photosensitive region 22 is covered with an electrically conductive and transparent diffusion barrier 23 (for example, hydrogenated carbonated silicon) and another doped P semi-conductor layer 24 placed on the diffusion barrier 23. Layer 24 is placed, for example, according to the PECVD (Plasma Enhanced Chemical Vapour Deposition) technique from the decomposition of Trimethylborane $(CH_3)3$-Si assisted by plasma. A metal pattern 26 covers the surface of the layer 24 and constitutes the second electrode of the detection pixel.

The pattern 26 can be made of, for example, Al, Cu, Cr, Ni, W, Ti, TiW, Mo, Ln, Pt, Pd, Au, TiN, or of alloys or combination of metals optimised for conductivity. For each pixel, the electrode 26 is extended by a side conductor link 27 attached to a metal connection 19a, 19c formed in the dielectric layer 18.

According to a first embodiment of the invention, the pixels or groups of pixels are separated from each other by straight sections 25, as indicated in FIG. 3. According to a second embodiment of the invention, the pixels are not separated by sections 25 but are contiguous. In the latter case, the distance between two pixels is chosen, for example, greater than 5 times the diffusion length of photogenerated charge carriers when the distance that the photogenerated charge carriers have to cover to rejoin the electrodes can be chosen, for example, less than 4 times the diffusion length of the charge carriers.

Advantageously, the imager according to the invention does not include dielectric mediums between pixels, and on output, it is not possible to establish leak currents such as those mentioned above. Furthermore, the photosensitive material is preferably made of amorphous or polymorphous silicon in order to increase stability and operating speed.

Figure 4A:
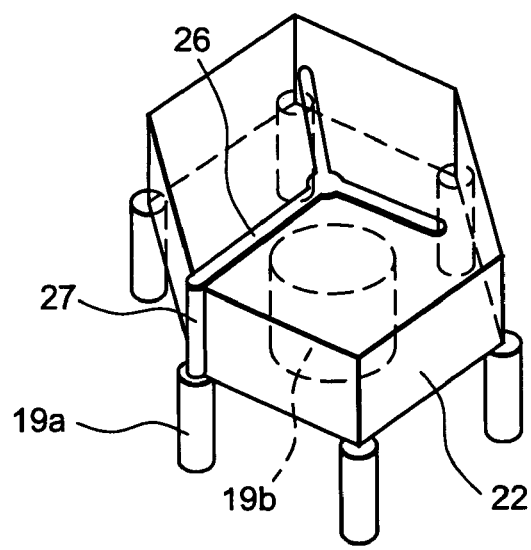
FIGS. 4A and 4B represent, respectively, the perspective view and the top view of a first pixel example of the imager according to the invention.
Figure 4B:
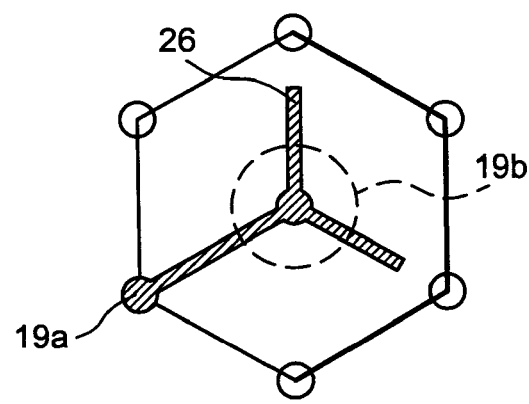

FIGS. 4A and 4B represent, respectively, the perspective view and the top view of a first pixel example of the imager according to the invention.

According to the example in FIGS. 4A and 4B, the pixel has a hexagonal shape and the electrode 26 that covers the layer 24 has a star shape with three branches at 120 degrees from each other. Two branches only extend partially to the surface of the layer 24, whilst the third one extends over the entire surface in order to join the side conductor link 27 attached to the metal connection 19a in the dielectric layer 18 (not represented on FIGS. 4A-4B.) The electrode 26 collects the charge carriers. The star shape of the electrode 26 advantageously allows concentrating the field lines towards the centre of the pixel, and on output, preventing the side dispersion of the loads. Furthermore, the weak electrical resistance of the contact between the doped P layer 24 and the electrode 26 allows obtaining a detector with three good performance levels in terms of response speed and noise. Furthermore, the metals that can be used to create electric contacts (electrodes, substrate connections, etc.) are perfectly compatible with the standard CMOS technologies. It is therefore possible, for example, to use an aluminium, titanium nitride, tungsten, or tungsten nitride electrical connection electrode.

The branches that comprise the electrode 26 are preferably made of very thin track, for example, of less than 0.3 micrometers or even less. The electrode 26 only covers a very small area of the layer 24, thus only preventing a very small amount of light from penetrating in the active area.

Figure 5:
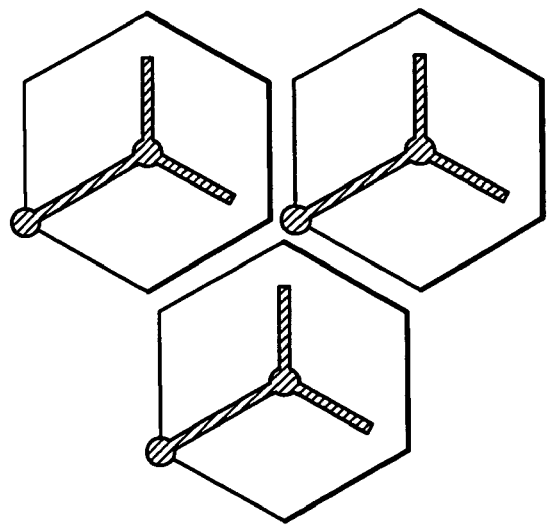
FIG. 5 represents a top view of a group of pixels of the imager according to the example illustrated in FIGS. 4A and 4B.

FIG. 5 represents a top view of a group of pixels of the imager as represented illustrated in FIGS. 4A and 4B. The association of pixels presents a bee's nest type configuration. Such a configuration is retained, among other reasons, because it allows avoiding angles that are too acute and which lead to local intensification of the electric field. The three pixels represented correspond, for example, to the three base colours, Red (R), Green (G), and Blue (B). The connection point of a top electrode with the reading circuit is located at the corner of the hexagon. Other configurations are nonetheless possible because, in a general manner, the position of the connection point is indeed chosen according to the reading circuit found under the dielectric layer.

FIGS. 6A and 6B represent, respectively, a top view and partial cut view of a group of pixels of the imager grouped according to the example in FIG. 5. The top electrodes 26 are linked using side connections 27 and electric connections formed in the dielectric layer 18 to electrical contact studs E1 of the substrate 17 and the bottom electrodes 20, 21 are linked to electrical the contact studs E2 of the substrate 17.

FIGS. 7A-7E represent different examples of the various geometries possible for the top electrode. As mentioned previously, the top electrode 26 is designed to optimise the collection of charge carriers whilst minimising optical absorption. The width of the tracks that constitute the electrode 26 is thus chosen for this purpose (for example, less than 0.3 micrometers, and mentioned above.) Furthermore, the tracks are positioned in order to focus the field lines towards the centre of the pixel, thus allowing maximum draining of the charge carriers towards the centre of the pixel.

Figure 7A:
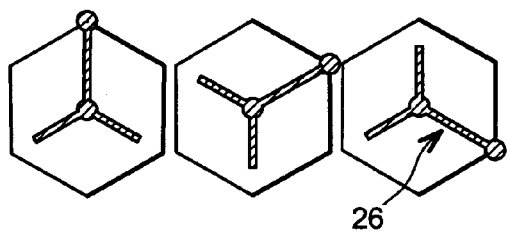
FIGS. 7A to 7E represent top views of groups of pixels presenting different electrode geometries.
Figure 7B:
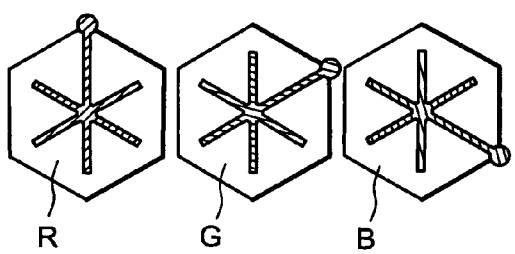

FIGS. 7A and 7B represent two star electrode variants. FIG. 7A represents the variant with three branches described above. FIG. 7B represents a six-branch variant, two neighbouring branches with a 60 degree angle between them.

Figure 7C:
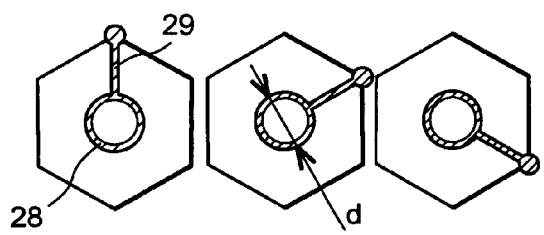
Figure 7D:
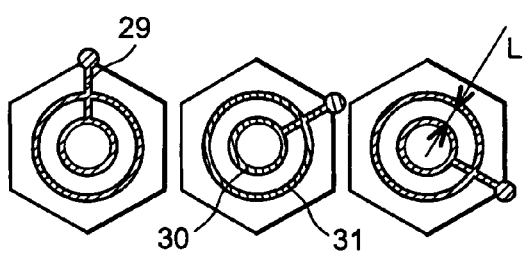

FIGS. 7C and 7D represent two variants of crown-shaped electrodes. According to the variant in FIG. 7C, the electrode 26 includes a central circular section 28 and a straight-line section 29 connected to the circular section 28. The straight-line section 29, located outside the surface that is delimited by the circular section 28, cuts the latter at a right angle.

According to the variant in FIG. 7D, the electrode 26 includes two central circular sections and a straight-line section. The central circular sections 30, 31 are concentric and both are connected to the straight-line section 29 at a right angle. Electrode patterns that include more than two circular sections or crowns are also possible. In a more general manner, indeed, the size and number of circular sections are adapted to the size of the pixel and to the diffusion length of the charge carriers in the material.

According to the invention, the size of the photosensitive semi-conductor area of a pixel is chosen at approximately a few diffusion lengths of the charge carriers. In the case represented in FIG. 7C, the diameter d of the crown 28 can, for example, be equal to three time the diffusion length of the charge carriers, and in the case of FIG. 7D, the crowns can be separated, for example, at a distance equal to three times the diffusion length of the charge carriers.

Figure 7E:
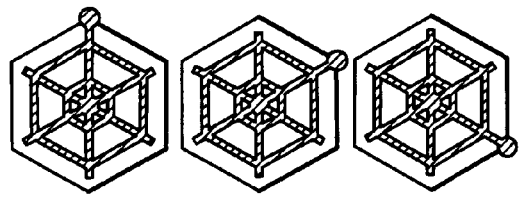

FIG. 7E represents a spider-web shaped electrode. The electrode 26, for example, includes two hexagon-shaped sections and six straight-line sections. The two hexagon-shaped sections are placed one into another and the six straight-line sections are such that two neighbouring sections make up a 60 degree angle with each other. As indicated previously, the sizes are adjusted based on the diffusion length of the charge carriers.

Figure 8A:
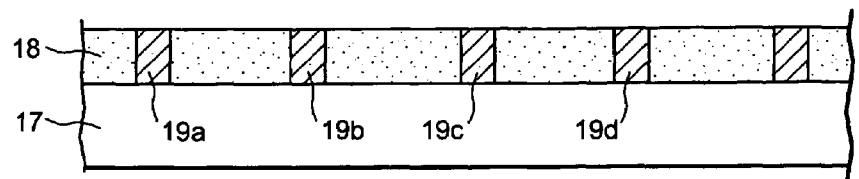
FIGS. 8A to 8D represent the stages of a procedure for manufacturing the photoelectric detector according to the invention.
Figure 8B:
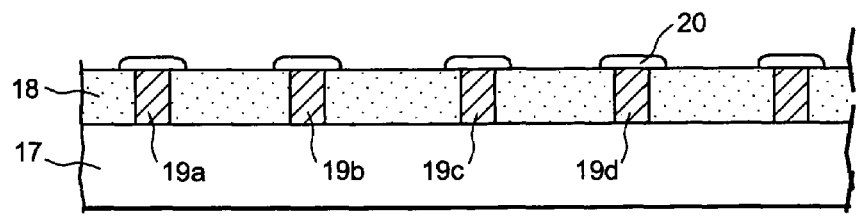
Figure 8C:
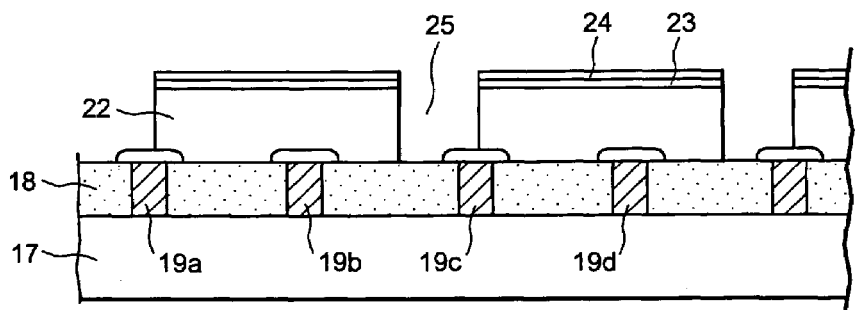

FIGS. 8A to 8D represent the different stages of an example of the procedure for manufacturing the photodetector device according to the invention. The dielectric layer 18 in which the electrical connections 19a, 19b, 19c, 19d are inserted are above all formed from the reading circuit 17 (See FIG. 8A.) The reading circuit 17 can have a flat surface, as illustrated in FIGS. 8A-8D, or a non-flat surface. Electrical contacts (diffusion barriers 20 and possibly conductor contact 21) are then formed on the electrical connections 19a, 19b, 19c, 19d, in order to create electrodes (See FIG. 8B.) An intrinsic semi-conductor layer then possibly a diffusion barrier layer and a doped P conductor layer are then placed on the dielectric layer 18. According to the example represented in FIGS. 8A-8D, the doped P semi-conductor layers, the diffusion barrier layers, and the photosensitive semi-conductor layers are then engraved in order to form a set of pixels separated from each other by sections 25 (FIG. 8C.) According to other embodiments of the invention (not represented in the Figures), the doped P semi-conductor, diffusion barrier, and photosensitive semi-conductor layers are not engraved so that the pixels are not separated by sections.

Figure 8D:
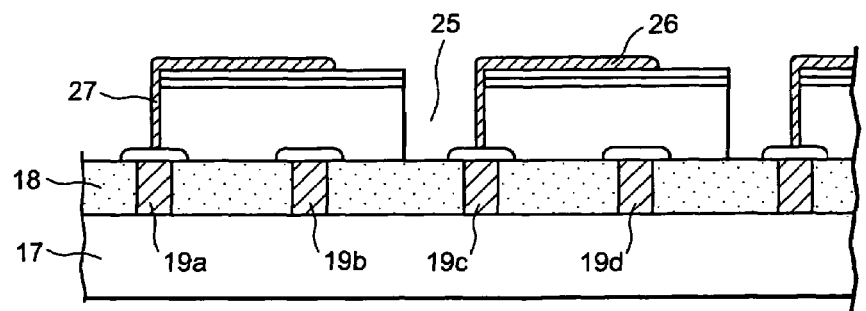

The metal patterns 26 are then formed on the pixel surface and connected, using side conductor links 27, to metal connections inserted in the dielectric layer 18 (See FIG. 8D.) The formation of surface electrodes 26 is performed, above all, by depositing a metal layer, then by engraving the metal layer thus placed in order to draw the electrode patters. The side electric links 27 are formed in the sections 25. In cases (not represented on the Figures) where there are no sections separating the pixels from each other, the side electric links 27 are performed according to the known technique of metalised holes.

According to a specific embodiment of the invention, the metal patterns 26 of several neighbouring pixels can be interconnected. As a non-limiting example, in the case of a hexagonal pixel structure such as the one represented, for example, in FIG. 9, it is thus possible to link several metal patterns 26 using electrical contacts C located between neighbouring pixels. The contacts C can therefore be linked to a same top conductor contact stud P1 whilst the lower electrodes 20, 21 are linked to a lower conductor contact stud P2. Grouping surface electrodes 26 of several neighbouring pixels allows smoothing or filtering images. It is therefore possible to eliminate the continuous background noise of the image or compose performance variations that result from technological fluctuations.

The invention claimed is:

1. A matrix of detection pixels comprising: a detection pixel including a photosensitive semiconductor area with a first face covered with a first electrode and a second face located opposite the first face and covered with a second electrode,
    wherein the photosensitive semiconductor area is configured to convert photons that act on the first face into charge carrier,
    wherein the first electrode includes metal patterns configured to collect the charge carriers generated in the photosensitive semiconductor area,
    wherein a shape of the metal pattern is configured so that the photosensitive semiconductor area constitutes, in its entirety, a collection area for all the charge carriers generated in the photosensitive semiconductor area,
    wherein trenches separate at least one detection pixel from at least one neighbouring detection pixel, and
    wherein the shape of the metal pattern is such that all points of the photosensitive semiconductor area of the detection pixel are at a distance from the metal pattern that is four times less than the distribution length of the charge carriers in the material of the photosensitive semiconductor area.

2. A matrix of detection pixels according to claim 1, wherein the detection pixels are grouped into blocks, and a block of detection pixels is composed of a plurality of neighbouring detection pixels whose metal patterns are electrically linked to each other.

3. A matrix of detection pixels according to claim 1, wherein the first face of a detection pixel is in a shape of a hexagon.

4. A matrix of detection pixels according to claim 1, wherein the shape of the metal pattern is configured to drain the charge carriers in a central area of the detection pixel.

5. A matrix of detection pixels according to claim 4, wherein a metal pattern includes a set of tracks in a shape of stars with plural branches and a center of the star is placed in the center of the first face.

6. A matrix of detection pixels according to claim 4, wherein a metal pattern includes at least one circular track and at least one straight-line track that cuts the circular track at a right angle, and a center of the circular track is positioned at a center of the first face.

7. A matrix of detection pixels according to claim 4, wherein a metal pattern includes at least one track in a form of a hexagon that is centered on the first face and at least one straight-line track that passes through the center of the hexagon and through two peaks that are symmetrical with respect to the center.

8. A matrix of detection pixels according to claim 5, wherein the tracks have a width that is less than 0.3 micrometers.

9. A matrix of detection pixels according to claim 1, wherein the metal pattern is in Al, Cu, Cr, Ni, W, Ti, TiW, Mo, In, Pt, Pd, Au, TiN, or in a metal alloy chosen from these metals.

10. A matrix of detection pixels according to claim 1, wherein the second electrode is composed of an electrical contact and a diffusion barrier layer.

11. A matrix of detection pixels according to claim 1, wherein a detection pixel includes, between the first face of the photosensitive semiconductor area and the metal pattern of the first electrode, a diffusion barrier layer in contact with the first face and a doped P semiconductor layer that covers the diffusion barrier layer.

12. A matrix of detection pixels according to claim 1, wherein the photosensitive semiconductor area is in amorphous silicon or polymorphous silicon.

13. A photoelectric detector comprising:
    a matrix of detection pixels and a reading circuit of charge carriers detected by the detection pixels, wherein the matrix of detection pixels is a matrix according to claim 1, formed on a dielectric layer in which electrical connections are inserted;
    wherein at least one detection pixel has the metal pattern of the first electrode connected, using a metal link, to a first electrical connection and the second electrode electrically linked to a second electrical connection.

14. A photoelectric detector according to claim 13, wherein the dielectric layer is formed directly on the reading circuit.

15. A photoelectric detector according to claim 13, wherein the reading circuit comprises a CMOS circuit.

16. A matrix of detection pixels comprising:
    a detection pixel including a photosensitive semiconductor area with a first face covered with a first electrode and a second face located opposite the first face and covered with a second electrode,
    wherein the photosensitive semiconductor area is configured to convert photons that act on the first face into charge carriers,
    wherein the first electrode includes metal patterns configured to collect the charge carriers generated in the photosensitive semiconductor area,
    wherein a shape of the metal pattern is configured so that the photosensitive semiconductor area constitutes, in its entirety, a collection area for all the charge carriers generated in the photosensitive semiconductor area, and
    wherein a metal pattern includes a set of tracks in a shape of stars with plural branches and a center of the star is placed in the center of the first face.

17. A matrix of detection pixels according to claim 16, wherein the tracks have a width that is less than 0.3 micrometers.

18. A matrix of detection pixels according to claim 16, wherein a detection pixel includes, between the first face of the photosensitive semiconductor area and the metal pattern of the first electrode, a diffusion barrier layer in contact with the first face and a doped P semiconductor layer that covers the diffusion barrier layer.

19. A photoelectric detector comprising:

a matrix of detection pixels and a reading circuit of charge carriers detected by the detection pixels, wherein the matrix of detection pixels is a matrix formed on a dielectric layer in which electrical connections are inserted and includes a detection pixel including a photosensitive semiconductor area with a first face covered with a first electrode and a second face located opposite the first face and covered with a second electrode, wherein the photosensitive semiconductor area is configured to convert photons that act on the first face into charge carriers, wherein the first electrode includes metal patterns configured to collect the charge carriers generated in the photosensitive semiconductor area, wherein a shape of the metal pattern is configured so that the photosensitive semiconductor area constitutes, in its entirety, a collection area for all the charge carriers generated in the photosensitive semiconductor area, and wherein at least one detection pixel has the metal pattern of the first electrode connected, using a metal link, to a first electrical connection and the second electrode electrically linked to a second electrical connection.

20. A photoelectric detector according to claim 19, wherein the dielectric layer is formed directly on the reading circuit.

21. A photoelectric detector according to claim 19, wherein the reading circuit comprises a CMOS circuit.

* * * * *